(12) United States Patent
Lou et al.

(10) Patent No.: US 12,137,594 B2
(45) Date of Patent: Nov. 5, 2024

(54) DISPLAY PANEL AND DRIVING METHOD THEREOF AND DISPLAY APPARATUS

(71) Applicant: KunShan Go-Visionox Opto-Electronics Co., Ltd., Kunshan (CN)

(72) Inventors: Junhui Lou, Kunshan (CN); Fengzhang Hu, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 353 days.

(21) Appl. No.: 17/591,247

(22) Filed: Feb. 2, 2022

(65) Prior Publication Data

US 2022/0157898 A1 May 19, 2022

Related U.S. Application Data

(63) Continuation of application No. PCT/CN2020/117241, filed on Sep. 23, 2020.

(30) Foreign Application Priority Data

Dec. 16, 2019 (CN) .......................... 201911292532.6

(51) Int. Cl.
*H10K 59/35* (2023.01)
*H10K 50/818* (2023.01)
*H10K 102/10* (2023.01)

(52) U.S. Cl.
CPC ......... *H10K 59/353* (2023.02); *H10K 50/818* (2023.02); *H10K 2102/102* (2023.02); *H10K 2102/103* (2023.02)

(58) Field of Classification Search
CPC ............ H01L 27/3218; H01L 27/3223; H10K 59/88; H10K 59/353
See application file for complete search history.

(56) References Cited

U.S. PATENT DOCUMENTS

2019/0355798 A1 11/2019 Chung et al.
2021/0050548 A1* 2/2021 Zeng .................... H10K 50/818
2021/0066409 A1* 3/2021 Fan ...................... H10K 59/131

FOREIGN PATENT DOCUMENTS

CN 108269840 A 7/2018
CN 109637452 A 4/2019
(Continued)

OTHER PUBLICATIONS

International Search Report mailed on Dec. 7, 2020, in corresponding to International Application No. PCT/CN2020/117241; 5 pages (with English Translation).

(Continued)

*Primary Examiner* — Suberr L Chi
(74) *Attorney, Agent, or Firm* — Maier & Maier, PLLC

(57) ABSTRACT

A display panel and driving method thereof and a display apparatus. The display panel has a first display area and a second display area, a transmittance of the first display area is greater than a transmittance of the second display area, the display panel includes an array substrate, and a light-emitting layer arranged on the array substrate and includes a first sub-pixel density distribution area arranged corresponding to the first display area, a second sub-pixel density distribution area arranged corresponding to the second display area and a third sub-pixel density distribution area on at least one of the first display area and the second display area and arranged adjacent to a boundary between the first display area and the second display area, in which a third sub-pixel distribution density is between a first sub-pixel distribution density and a second sub-pixel distribution density.

20 Claims, 4 Drawing Sheets

(56) References Cited

FOREIGN PATENT DOCUMENTS

| | | |
|---|---|---|
| CN | 110148621 A | 8/2019 |
| CN | 110275358 A | 9/2019 |
| CN | 110310576 A | 10/2019 |
| CN | 110379836 A | 10/2019 |
| CN | 209487510 U | 10/2019 |
| CN | 110504289 A | 11/2019 |
| CN | 111192902 A | 5/2020 |

OTHER PUBLICATIONS

The First Office Action for Chinese Application No. 201911292532.6, dated Dec. 28, 2020, 15 pages.
The Second Office Action for Chinese Application No. 201911292532.6, dated Feb. 19, 2021, 15 pages.
Notification to Grant Patent Right for Invention for Chinese Application No. 201911292532.6, dated Apr. 16, 2021, 6 pages.

* cited by examiner

DISPLAY PANEL AND DRIVING METHOD THEREOF AND DISPLAY APPARATUS

CROSS REFERENCE TO RELATED APPLICATION

The present application is a continuation of International Application No. PCT/CN2020/117241 filed on Sep. 23, 2020, which claims the benefit of priority to Chinese Patent Application No. 201911292532.6 filed on Dec. 16, 2019, both of which are incorporated herein by reference in their entireties.

TECHNICAL FIELD

The present application relates to the field of display, and particularly to a display panel and driving method thereof and a display apparatus.

BACKGROUND

With the rapid development of electronic devices, demands of users for the screen-to-body ratio are higher and higher, resulting in that the full-screen display of electronic devices attracts more and more attention in the industry.

Traditional electronic devices such as a cell phone and a tablet computer needs to integrate a front camera, a telephone receiver, an infrared sensing component and the like. In the prior art, a notch or a hole is formed in the display screen so that external light can enter the photosensitive component under the screen through the notch or the hole. Nonetheless, such electronic devices do not achieve a real full-screen display, and cannot display an image in all areas of the entire screen. For example, the area corresponding to the front camera cannot display the image.

SUMMARY

A first aspect of the present application provides a display panel having a first display area and a second display area, a transmittance of the first display area being greater than a transmittance of the second display area, the display panel comprising: an array substrate; a light-emitting layer arranged on the array substrate and comprising a first sub-pixel density distribution area arranged corresponding to the first display area, a second sub-pixel density distribution area arranged corresponding to the second display area and a third sub-pixel density distribution area on at least one of the first display area and the second display area and arranged adjacent to a boundary between the first display area and the second display area; wherein a first sub-pixel distribution density corresponding to the first sub-pixel density distribution area is less than a third sub-pixel distribution density corresponding to the third sub-pixel density distribution area, and the third sub-pixel distribution density is less than a second sub-pixel distribution density corresponding to the second sub-pixel density distribution area.

A second aspect of the present application provides a display apparatus comprising the display panel of any one of the embodiments of the first aspect described above.

According to the display panel of the embodiments of the present application, the transmittance of the first display area is greater than the transmittance of the second display area, so that a photosensitive component can be integrated on the rear of the first display area of the display panel. The under-screen integration is achieved for the photosensitive component such as a camera, and moreover, the first display area can display an image, so the display area of the display panel is increased, and a full-screen design is achieved for the display apparatus.

According to the display panel of the embodiments of the present application, the third sub-pixel density distribution area is on at least one of the first display area and the second display area and arranged adjacent to the boundary between the first display area and the second display area, and the third sub-pixel distribution density corresponding to the third sub-pixel density distribution area is between the second sub-pixel distribution density corresponding to the second sub-pixel density distribution area and the first sub-pixel distribution density corresponding to the first sub-pixel density distribution area. The third sub-pixels are derived by a second pixel circuit used to drive the second sub-pixels, and the display brightness of the third sub-pixels can be controlled to be the same as that of the second sub-pixels emitting a same color, so that the boundary between the second display area with a higher pixels per inch (Pixels Per Inch, PPI) and the first display area with a lower PPI in the display image of the display panel is blurred, obvious bright lines or dark lines at the boundary between the two display areas are avoided and the display effect is improved.

DETAILED DESCRIPTION

Features and exemplary embodiments of various aspects of the present application will be described in detail below. To make the objects, technical solutions, and advantages of the present application clearer, the present application will be further described in detail below with reference to the accompanying drawings and specific embodiments. It is understood that the specific embodiments described herein are merely configured to explain the present application, rather than to limit the present application. For those skilled in the art, the present application can be implemented without some of these specific details. The following description of the embodiments is merely to provide a better understanding of the present application by illustrating the examples of the present application.

In an electronic device such as a cell phone and a tablet computer, it is needed to integrate a photosensitive component such as a front camera, an infrared light sensor, and a proximity light sensor at the side where the display panel is arranged. In some embodiments, a light-transmitting display area may be arranged in the above electronic device, and the photosensitive component is arranged on the rear of the light-transmitting display area. A full-screen display is achieved for the electronic device while the photosensitive component is guaranteed to work normally.

In order to increase the transmittance of the light-transmitting display area and to facilitate an arrangement of pixel driving circuits for sub-pixels in the light-transmitting display area, it is usually necessary to decrease the PPI of the light-transmitting display area and even part of the display area around the light-transmitting display area, so that this PPI is lower than the PPI of the main display area of the display panel. In this case, when the display panel is displaying, an obvious display boundary is usually formed between the display area with a higher PPI and the display area with a lower PPI, which will affect the display effect.

To solve the above problems, the embodiments of the present application provide a display panel and driving method thereof and a display apparatus, which will be described below with reference to the drawings.

The embodiments of the present application provide a display panel, which may be an organic light emitting diode (Organic Light Emitting Diode, OLED) display panel.

Figure 1:
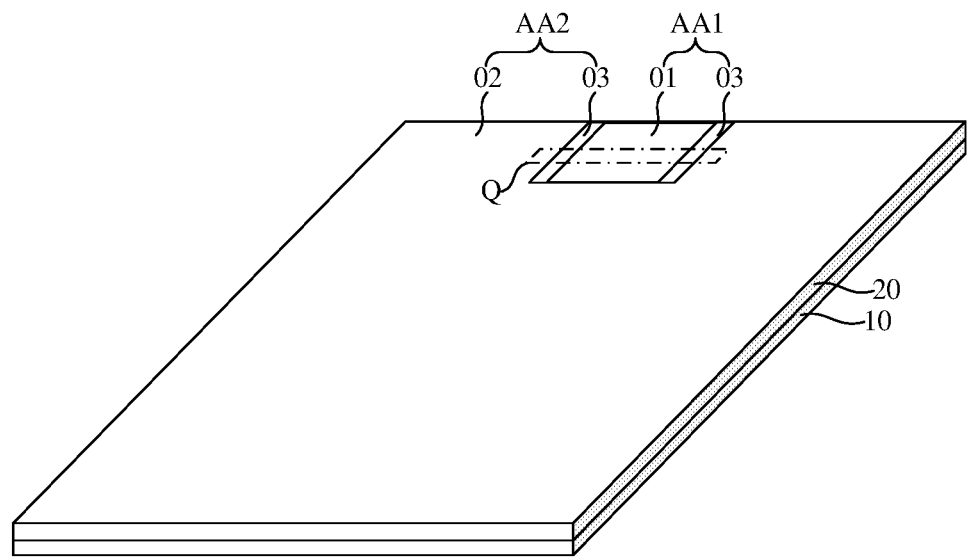
FIG. 1 shows a schematic structural diagram of a display panel according to the present application.
Figure 2:
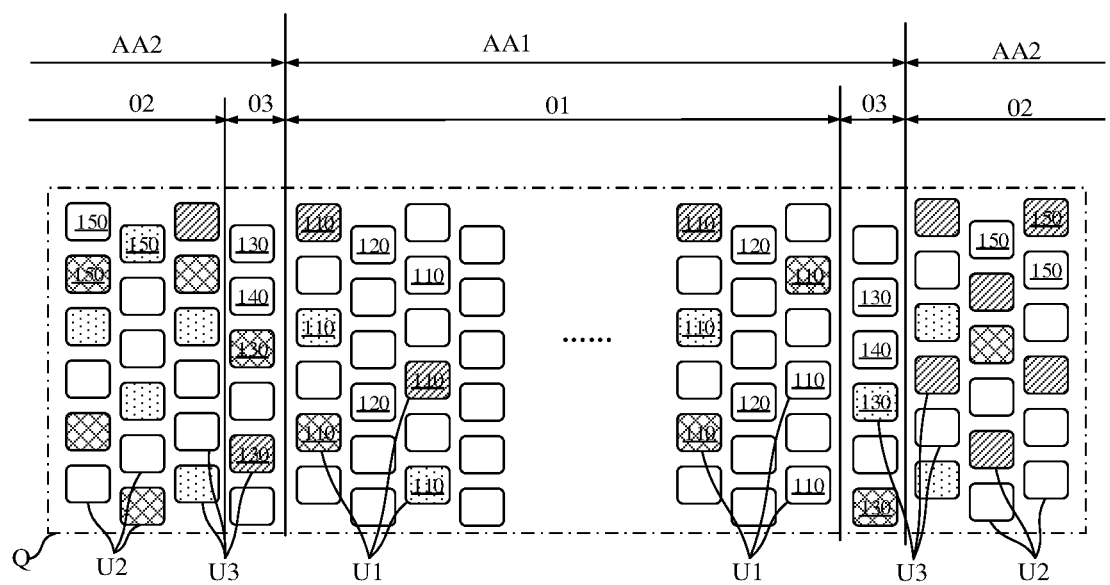
FIG. 2 shows a partial enlarged top view of the area Q in FIG. 1.

FIG. 1 shows a schematic structural diagram of a display panel according to the present application, and FIG. 2 shows a partial enlarged diagram of the area Q in FIG. 1.

As shown in FIG. 1, the display panel 100 has a first display area AA1 and a second display area AA2, and the transmittance of the first display area AA1 is greater than the transmittance of the second display area AA2.

In the present application, the transmittance of the first display area AA1 is preferably greater than or equal to 15%. To ensure that the transmittance of the first display area AA1 is greater than 15%, or even greater than 40%, or even a higher transmittance, the transmittance of at least part of functional films of the display panel 100 in the embodiment is greater than 80%, and even the transmittance of at least part of the functional films is greater than 90%.

According to the display panel 100 of the embodiments of the present application, the transmittance of the first display area AA1 is greater than the transmittance of the second display area AA2, so that a photosensitive component can be integrated on the rear of the first display area AA1 of the display panel 100. The under-screen integration is achieved for the photosensitive component such as a camera, and moreover, the first display area AA1 can display an image, so the display area of the display panel 100 is increased, and a full-screen design is achieved for the display apparatus.

As shown in FIG. 1, the display panel 100 includes an array substrate 10 and a light-emitting layer 20 arranged on the array substrate 10. The light-emitting layer 20 includes a first sub-pixel density distribution area 01 arranged corresponding to the first display area AA1, a second sub-pixel density distribution area 02 arranged corresponding to the second display area AA2, and a third sub-pixel density distribution area 03 on at least one of the first display area AA1 and the second display area AA2 and arranged adjacent to a boundary between the first display area AA1 and the second display area AA2.

A first sub-pixel distribution density corresponding to the first sub-pixel density distribution area 01 is less than a third sub-pixel distribution density corresponding to the third sub-pixel density distribution area 03, and the third sub-pixel distribution density is less than a second sub-pixel distribution density corresponding to the second sub-pixel density distribution area 02.

In the present application, the first sub-pixel distribution density, the second first sub-pixel distribution density, and the third first sub-pixel distribution density may refer to pixel densities corresponding to each of the three regions.

In the embodiments of the present application, the third sub-pixel density distribution area 03 is not an area other than the first display area AA1 and the second display area AA2, but is part of the first display area AA1 and/or the second display area AA2 and adjacent to the boundary between the first display area AA1 and the second display area AA2. As shown in FIG. 1, the first display area AA1 is a rectangular area, bright stripes are usually formed at the left boundary between the first display area AA1 and the second display area AA2, and dark stripes are usually formed at the right boundary between the first display area AA1 and the second display area AA2. Exemplarily, a third sub-pixel density distribution area 03 is arranged at each of the left and right boundaries, in which the third sub-pixel density distribution area 03 on the left is in the second display area AA2, and the third sub-pixel density distribution area 03 on the right is in the first display area AA1.

Exemplarily, as shown in FIG. 2, the sub-pixels in the first display area AA1 and the second display area AA2 are arranged by a same sub-pixel arrangement rule, that is, the sub-pixel arrangement rules of the first sub-pixel density distribution area 01, the second sub-pixel density distribution in the area 02 and the third sub-pixel density distribution area 03 are the same. Further, virtual sub-pixels are arranged within the first sub-pixel density distribution area 01 and the third sub-pixel density distribution area 03, and the distribution density of virtual sub-pixels in the first sub-pixel density distribution area 01 is greater than the distribution density of virtual sub-pixels in the third sub-pixel density distribution area 03. It may be understood that, under this sub-pixel arrangement rule, the virtual sub-pixels occupy the positions of the real sub-pixels, that is, the positions occupied by the virtual sub-pixels are non-light-emitting areas.

Figure 3:
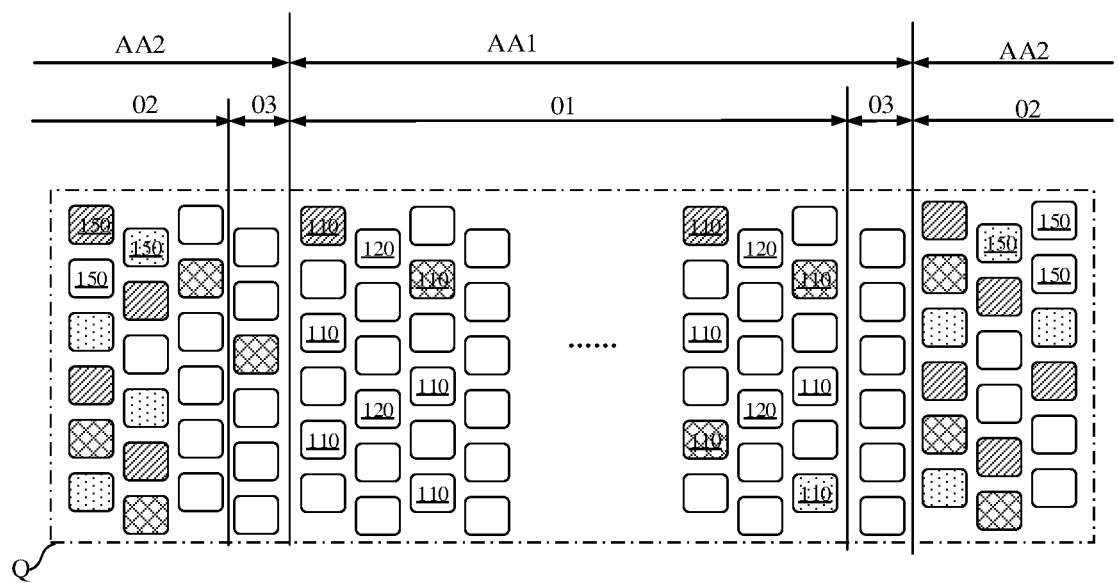
FIG. 3 shows another partial enlarged top view of the area Q in FIG. 1.

For a better understanding of the present application, as shown in FIG. 3, the embodiments of the present application provide a diagram of a comparison example of FIG. 2. Exemplarily, a column of sub-pixels of the second display area AA2 at the left boundary between the first display area AA1 and the second display area AA2 as shown in FIG. 3 may be halved to obtain the third sub-pixel density distribution area 03 on the left as shown in FIG. 2. Further, some sub-pixels are arranged at the positions occupied by a column of virtual sub-pixels of the first display area AA1 at the right boundary between the first display area AA1 and the second display area AA2 as shown in FIG. 3 to obtain the third sub-pixel density distribution area 03 on the right as shown in FIG. 2.

According to the embodiments of the present application, the third sub-pixel density distribution area 03 is on at least one of the first display area AA1 and the second display area AA2 and arranged adjacent to the boundary between the first display area AA1 and the second display area AA2, and the third sub-pixel distribution density corresponding to the third sub-pixel density distribution area 03 is between the second sub-pixel distribution density corresponding to the second sub-pixel density distribution area 02 and the first sub-pixel distribution density corresponding to the first sub-pixel density distribution area 01. In a low PPI area, the pixel density is low, and the brightness of an individual sub-pixel driven by a first pixel circuit is greater than that of a high PPI area. The sub-pixels in the third sub-pixel density distribution area are driven by a second pixel circuit used to drive the sub-pixels in the high PPI area, the bright lines or the dark lines at the boundary can be weaken to blur the boundary between the second display area with a higher PPI and the first display area with a lower PPI in the display image of the display panel 100, and obvious bright lines or dark lines at the boundary between the two display areas are avoided and the display effect is improved.

As shown in FIGS. 1 and 2, the first sub-pixel density distribution area 01 is disposed with a plurality of first sub-pixels 110, the second sub-pixel density distribution area 02 is disposed with a plurality of second sub-pixels 150, and the third sub-pixel density distribution area 03 is disposed with a plurality of third sub-pixels 130.

As shown in FIG. 2, for example, the short edge (a horizontal direction) of the display panel 100 is considered as a width direction. In the width direction of the display panel 100, the third sub-pixel density distribution area 03 is between the first sub-pixel density distribution area 01 and the second sub-pixel density distribution area 02. A column of the third sub-pixels 130 is arranged in a direction perpendicular to the width direction.

Exemplarily, as shown in FIGS. 1 and 2, the first display area AA1 is a rectangular area, and each of third sub-pixel density distribution areas 03 on the left and right includes only one column of the third sub-pixels 130. It may be understood that the third sub-pixel density distribution area 03 on the left originally corresponds to the second sub-pixel distribution density, that is, the third sub-pixel density distribution area 03 on the left originally has the second sub-pixels 150 distributed therein, and moreover, there may be bright lines at this boundary. Exemplarily, the second sub-pixels 150 distributed in the third sub-pixel density distribution area 03 on the left may be halved to obtain the third sub-pixels 130 arranged with the third sub-pixel distribution density, so that the bright lines at the left boundary can be blurred. Similarly, the third sub-pixel density distribution area 03 on the right originally corresponds to the first sub-pixel distribution density, that is, there is no sub-pixel in the third sub-pixel density distribution area 03 on the right, and moreover, there may be dark lines at this boundary. Exemplarily, the third sub-pixels 130 may be added to the third sub-pixel density distribution area 03 on the right to obtain the third sub-pixels 130 arranged with the third sub-pixel distribution density, so that the dark lines at the right boundary can be blurred.

According to the embodiments of the present application, the third sub-pixel density distribution area 03 can be obtained by changing only one column of sub-pixels, the process difficulty and complexity are reduced, and the third sub-pixel density distribution area 03 includes a column of the third sub-pixels 130, which can blur the boundary between the first display area AA1 and the second display area AA2 to the greatest extent.

In some embodiments, the display panel 100 further includes a plurality of first virtual sub-pixels 120 in the first sub-pixel density distribution area 01, and a plurality of second virtual sub-pixels 140 in the third sub-pixel density distribution area 03. A first pixel arrangement formed by the first sub-pixels 110 and the first virtual sub-pixels 120 is the same as a second pixel arrangement formed by the second sub-pixels 150. A third pixel arrangement formed by the third sub-pixels 130 and the second virtual sub-pixels 140 is the same as the second pixel arrangement.

It may be understood that areas corresponding to the first virtual sub-pixels 120 and the second virtual sub-pixels 140 do not have a pixel structure, that is, the areas corresponding to the virtual sub-pixels do not emit light, and the distance between the adjacent first sub-pixels 110 and the distance between the adjacent third sub-pixels 130 are greater than the distance of the adjacent second sub-pixels 150.

In some embodiments, the first sub-pixels 110 and the second sub-pixels 150 each include a plurality of sub-pixels emitting different colors. In FIGS. 1 and 2, sub-pixels emitting different colors are distinguished by different filling patterns, and sub-pixels emitting same colors are depicted using a same filling pattern.

Exemplarily, the first sub-pixels 110 may include a red first sub-pixel 110, a green first sub-pixel 110, or a blue first sub-pixel 110. The second sub-pixels 150 may include a red second sub-pixel 150, a green second sub-pixel 150, or a blue second sub-pixel 150. The third sub-pixels 130 may include a red third sub-pixel 130, a green third sub-pixel 130, or a blue third sub-pixel 130, or the third sub-pixels 130 may include third sub-pixels emitting same colors.

In some embodiments, one red first sub-pixel 110, one green first sub-pixel 110, and one blue first sub-pixel 110 in the first sub-pixel density distribution area 01 form a first pixel light-emitting unit U1. One red second sub-pixel 150, one green second sub-pixel 150, and one blue second sub-pixel 150 in the second sub-pixel density distribution area 02 form a second pixel light-emitting unit U2. One third sub-pixel 130 emitting a first color in the third sub-pixel density distribution area 03, and one second sub-pixel 150 emitting a second color and one second sub-pixel 150 emitting a third color in the second sub-pixel density distribution area 02 form a third pixel light-emitting unit U3.

The number and colors of sub-pixels included in each pixel light-emitting unit may be adjusted according to the design requirements of the display panel 100, and thus are not limited to the examples in the above embodiments. In addition, the arrangements of various sub-pixels in each pixel light-emitting unit are not limited to the examples in the above embodiments.

According to the display panel 100 of the embodiments of the present application, since the first display area AA1 includes sub-pixels capable of emitting light and displaying and virtual sub-pixels that do not emit light and display, the actual PPI of the first display area AA1 can be decreased, in which only the sub-pixels capable of emitting light and displaying need to be connected with driving signal lines, which reduces the number of the driving signal lines in the first display area AA1 and facilitates the increase of the transmittance of the first display area AA1.

Further, the first pixel arrangement formed by the first sub-pixels 110 and the first virtual sub-pixels 120 is the same as a second pixel arrangement formed by the second sub-pixels 150, and the third pixel arrangement formed by the third sub-pixels 130 and the second virtual sub-pixels 140 is the same as the second pixel arrangement, so that the display effect of the two display areas are more uniform, thereby further avoiding an obvious boundary between the two display areas and improving the display effect.

In some embodiments, in the first pixel arrangement, one of the plurality of first virtual sub-pixels 120 is arranged between two adjacent first sub-pixels 110, so that the first sub-pixels 110 emitting each of various colors in the first sub-pixel density distribution area 01 can be evenly distributed, and the color uniformity of display is improved.

In some embodiments, in the third pixel arrangement, one of the plurality of second virtual sub-pixels 140 is arranged between two adjacent third sub-pixels 130, so that the third sub-pixels 130 emitting each of various colors in the third sub-pixel density distribution area 03 can be evenly distributed, and the color uniformity of display is improved.

In some embodiments, the first sub-pixels 110 and the first virtual sub-pixels 120 are arranged in an array to form a plurality of rows and/or a plurality of columns In some embodiments, as shown in FIG. 2, for the first sub-pixels 110 in adjacent two columns, the first sub-pixels 110 emitting a same color are in different rows. Or for the first sub-pixels 110 in adjacent two rows, the first sub-pixels 110 emitting a same color are in different columns. Therefore, the first sub-pixels 110 emitting each of various colors in the first sub-pixel density distribution area 01 are further evenly distributed, and the color uniformity of display is further improved.

Figure 4:
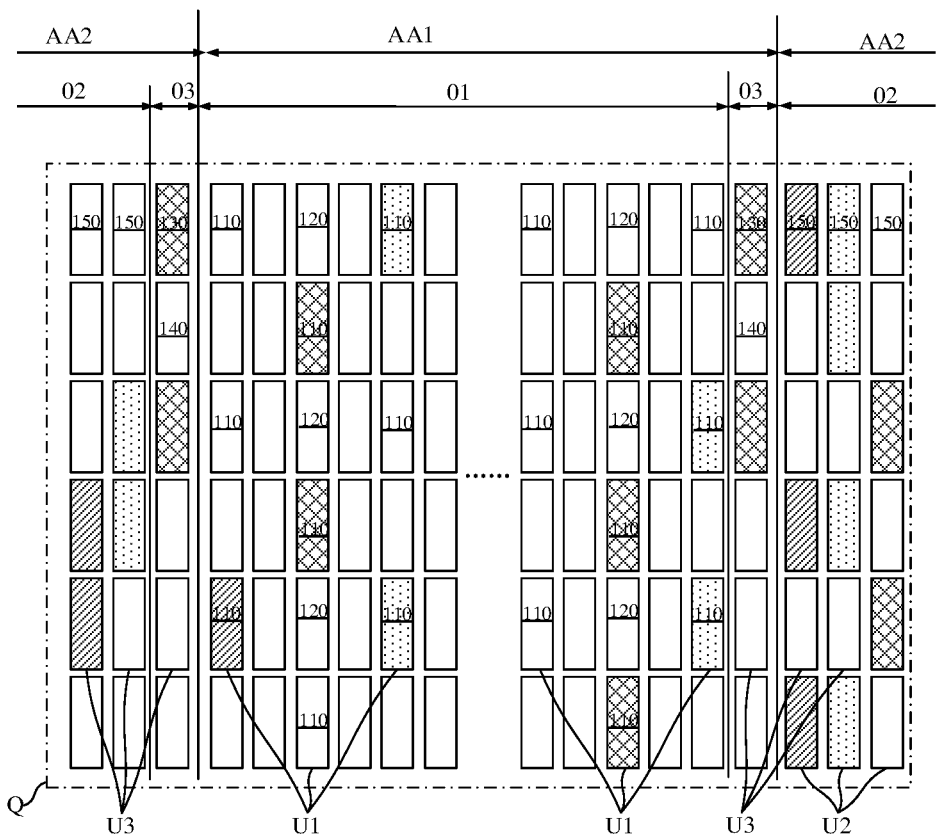
FIG. 4 shows yet another partial enlarged top view of the area Q in FIG. 1.

In some embodiments, as shown in FIG. 4, the first pixel arrangement formed by the first sub-pixels 110 and the first virtual sub-pixels 120 is a standard RGB sub-pixel arrangement. The first sub-pixels 110 in a same row or a same column emit same colors. Therefore, the first sub-pixels 110 emitting each of various colors in the first sub-pixel density distribution area 01 are further evenly distributed, and the color uniformity of display is further improved.

In some embodiments, still referring to FIG. 4, the first pixel arrangement formed by the first sub-pixels 110 and the first virtual sub-pixels 120, the second pixel arrangement formed by the second sub-pixels 150, and the third pixel arrangement formed by the third sub-pixels 130 and the second virtual sub-pixels 140 each is the standard RGB sub-pixel arrangement. The third sub-pixel density distribution area 03 includes only one column of the third sub-pixels 130, and the third sub-pixels 130 emit a color different from colors emitted by both the first sub-pixels 110 and the second sub-pixels 150 adjacent to the third sub-pixels 130. Therefore, the sub-pixels emitting each of various colors at the boundary between the first display area AA1 and the second display area AA2 are further evenly distributed, the color uniformity of display is further improved, and the boundary between the first display area AA1 and the second display area AA2 is further blurred.

In some embodiments, the display panel 100 further includes a first pixel circuit and a second pixel circuit (not shown), both of which are disposed in the second display area AA2. The first pixel circuit is electrically connected with the first sub-pixels 110 to drive the first sub-pixels 110 to display. The second pixel circuit are electrically connected with both the second sub-pixels 150 and the third sub-pixels 130 to drive the second sub-pixels 150 and the third sub-pixels 130 to display.

In some embodiments, the circuit structure of the first pixel circuit is any one of a 2T1C circuit, a 7T1C circuit, a 7T2C circuit or a 9T1C circuit. In the present application, the "2T1C circuit" refers to a pixel circuit including two thin film transistors (T) and one capacitor (C), and the same applies to the "7T1C circuit", "7T2C circuit", "9T1C circuit", and so on.

According to the display panel 100 of the embodiments of the present application, the first pixel circuit configured to drive the first sub-pixels 110 to display is in the second display area AA2, so the wiring structure of the first display area AA1 is reduced and the transmittance of the first display area AA1 is increased.

In some embodiments, the circuit structure of the second pixel circuit may be any one of a 2T1C circuit, a 7T1C circuit, a 7T2C circuit or a 9T1C circuit. The circuit structures of the pixel circuits for the second sub-pixels 150 and the third sub-pixels 130 are the same. For example, for a pure color image, to make the display effect of the first display area AA1 and the second display area AA2 as consistent as possible, the brightness of the first sub-pixels 110 are higher than that of the second sub-pixels 150. In the embodiments of the present application, at the left boundary where the first display area AA1 is adjacent to the second display area AA2, a column of sub-pixels in the second display area AA2 and adjacent to the first display area AA1 is halved, and at the right boundary where the first display area AA1 is adjacent to the second display area AA2, sub-pixels are added to the positions occupied by a column of virtual sub-pixels in the first display area AA1 and adjacent to the second display area AA2 to obtain the third sub-pixels, thereby forming the third sub-pixel density distribution area 03. Further, by using the second pixel circuit to drive the second sub-pixels 150 and the third sub-pixels 130, the display brightness of the third sub-pixels 130 can be controlled to be the same as that of the second sub-pixels 150 emitting a same color, and the boundary between the first display area AA1 and the second display area AA2 can be further blurred.

In some embodiments, each of the first sub-pixels 110 includes a first electrode, a light-emitting structure, and a second electrode that are stacked in sequence. One of the first electrode and the second electrode is an anode, and the other is a cathode. In the embodiment, for example, the first electrode is the anode and the second electrode is the cathode.

The light-emitting structure may include an organic light emitting diode (Organic Light Emitting Diode, OLED) light-emitting layer, and according to the design requirements of the light-emitting structure, the OLED light-emitting structure may further include at least one of a hole inject layer, a hole transport layer, an electron inject layer or an electron transport layer.

In some embodiments, the first electrode is a light-transmitting electrode. In some embodiments, the first electrode includes an indium tin oxide (Indium Tin Oxide, ITO) layer or an indium zinc oxide layer. In some embodiments, the first electrode is a reflective electrode, and includes a first light-transmitting conductive layer, a reflective layer on the first light-transmitting conductive layer, and a second light-transmitting conductive layer on the reflective layer. Herein, the first light-transmitting conductive layer and the second light-transmitting conductive layer may be ITO, indium zinc oxide or the like, and the reflective layer may be a metal layer, for example, made of silver.

In some embodiments, the second electrode includes a magnesium-silver alloy layer. In some embodiments, the second electrodes may be interconnected as a common electrode.

In some embodiments, a projection of the light-emitting structure in a direction perpendicular to the display panel consists of one first graphic unit or two or more first graphic units spliced together, and the first graphic unit includes at least one selected from a group including a round shape, an oval shape, a dumb-bell shape, a gourd shape and a rectangle shape.

In some embodiments, a projection of the first electrode in a direction perpendicular to the display panel consists of one second graphic unit or two or more second graphic units spliced together, and the second graphic unit includes at least one selected from a group including a round shape, an oval shape, a dumb-bell shape, a gourd shape and a rectangle shape.

Exemplarily, the display panel 100 may further include an encapsulation layer, and a polarizer and a cover plate that are disposed on the encapsulation layer. Alternatively the cover plate may be directly arranged on the encapsulation layer without the polarizer, or the cover plate is directly arranged on the encapsulation layer at least in the first display area AA1 without the polarizer so as to prevent the polarizer from affecting the light collection amount of the photosensitive component correspondingly arranged under the first display area AA1. Of course, the polarizer may also be arranged on the encapsulation layer in the first display area AA1.

The embodiments of the present application further provide a display apparatus which may include the display panel 100 of any one of the above embodiments. A display apparatus of an embodiment will be described below as an example, in which the display apparatus includes the display panel 100 of the above embodiments.

Figure 5:
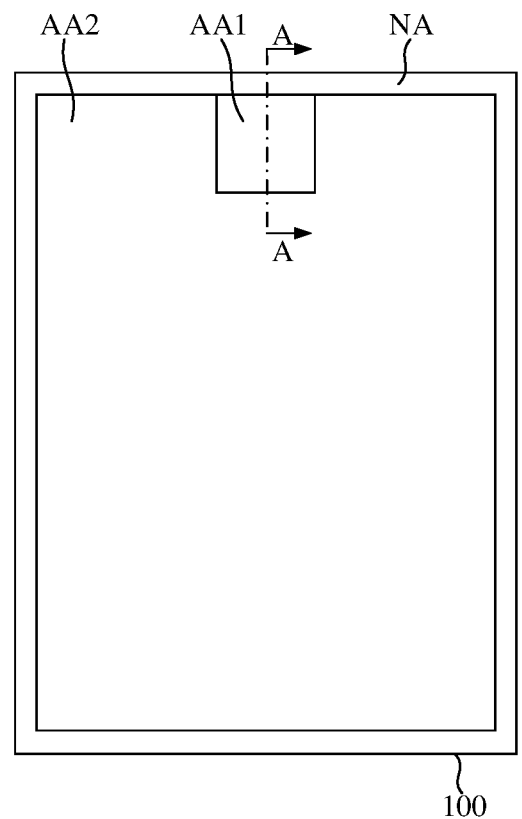
FIG. 5 shows a top view of a display apparatus according to the embodiments of the present application.
Figure 6:
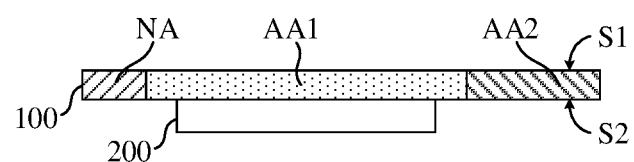
FIG. 6 shows a cross-sectional view taken along the line A-A in FIG. 5.

FIG. 5 shows a top view of a display apparatus according to the present application, and FIG. 6 shows a cross-sectional view taken along the line A-A in FIG. 5. In the display apparatus of the embodiment, the display panel 100 may be the display panel 100 of one of the above embodiments, in which the display panel 100 includes a first display area AA1, a second display area AA2, and a non-display area NA surrounding the first display area AA1 and the second display area AA2, and the transmittance of the first display area AA1 is greater than the transmittance of the second display area AA2.

The display panel 100 includes a first surface S1 and a second surface S2 opposing to each other, in which the first surface S1 is a display surface. The display apparatus further includes a photosensitive component 200 at the side corresponding to the second surface S2 of the display panel 100, and the photosensitive component 200 corresponds to the position of the first display area AA1.

The photosensitive component 200 may be an image capturing component for capturing external image information. In the embodiment, the photosensitive component 200 is a complementary metal oxide semiconductor (Complementary Metal Oxide Semiconductor, CMOS) image capturing component, and in some other embodiments, the photosensitive component 200 may also be other image capturing components such as a charge-coupled device (Charge-coupled Device, CCD) image capturing component. It may be appreciated that the photosensitive component 200 may not be limited to an image capturing component. For example, in some embodiments, the photosensitive component 200 may also be a light sensor such as an infrared sensor, a proximity sensor, an infrared lens, a flood light sensing element, an ambient light sensor and a dot projector. In addition, other components such as a telephone receiver and a speaker may also be integrated on the second surface S2 of the display panel 100 of the display apparatus.

According to the display apparatus of the embodiments of the present application, the transmittance of the first display area AA1 is greater than the transmittance of the second display area AA2, so that the photosensitive component 200 may be integrated on the rear of the first display area AA1 of the display panel 100. An under-screen integration is achieved for the photosensitive component 200 such as an image capturing component, and moreover, the first display area AA1 can display the image, the display area of the display panel 100 is increased and a full-screen design is achieved for the display apparatus.

The third sub-pixel density distribution area 03 is on at least one of the first display area AA1 and the second display area AA2 and arranged adjacent to the boundary between the first display area AA1 and the second display area AA2, and the third sub-pixel distribution density corresponding to the third sub-pixel density distribution area 03 is between the second sub-pixel distribution density corresponding to the second sub-pixel density distribution area 02 and the first sub-pixel distribution density corresponding to the first sub-pixel density distribution area 01, so that the boundary between the second display area AA2 with a higher PPI and the first display area AA1 with a lower PPI in the display image of the display panel is blurred, obvious bright lines or dark lines at the boundary between the two display areas are avoided and the display effect is improved.

Figure 7:
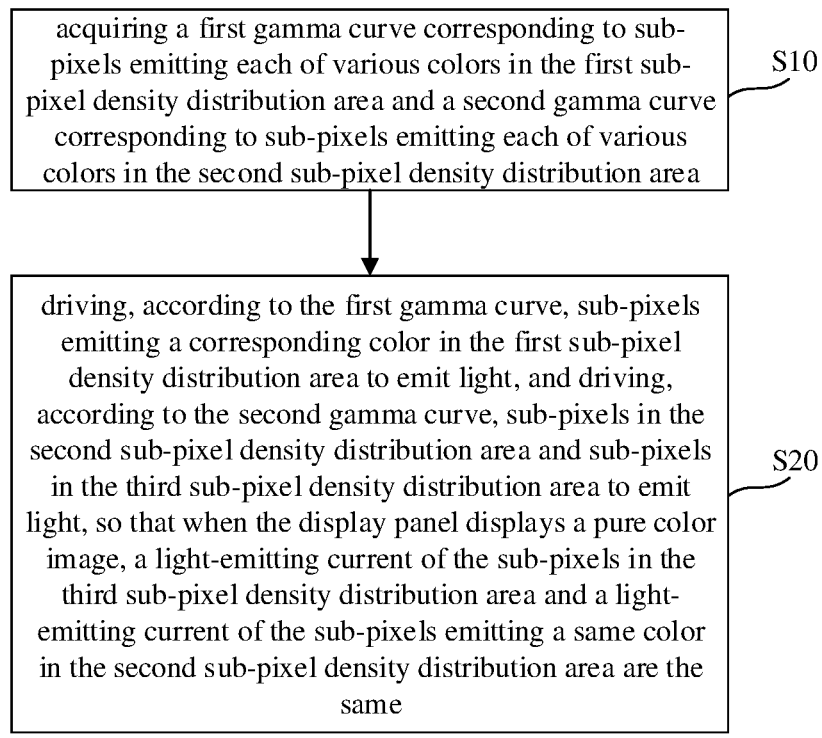
FIG. 7 shows a schematic flowchart of a driving method of a display panel according to the present application.

The embodiments of the present application further provide a driving method of a display panel for driving the display panel 100 of any one of the above embodiments. FIG. 7 shows a schematic flowchart of a driving method of a display panel provided according to the present application. As shown in FIG. 7, the driving method of a display panel includes the following steps:

S10: acquiring a first gamma curve corresponding to sub-pixels emitting each of various colors in the first sub-pixel density distribution area and a second gamma curve corresponding to sub-pixels emitting each of various colors in the second sub-pixel density distribution area;

S20: driving, according to the first gamma curve, sub-pixels emitting a corresponding color in the first sub-pixel density distribution area to emit light, and driving, according to the second gamma curve, sub-pixels in the second sub-pixel density distribution area and sub-pixels in the third sub-pixel density distribution area to emit light, so that when the display panel displays a pure color image, a light-emitting current of the sub-pixels in the third sub-pixel density distribution area and a light-emitting current of the sub-pixels emitting a same color in the second sub-pixel density distribution area are the same.

Herein, the first gamma curve and the second gamma curve characterize a corresponding relationship between the gamma voltage and the light-emitting current of the sub-pixel emitting a corresponding color.

According to the driving method of a display panel provided by the embodiments of the present application, through driving, according to the second gamma curve, sub-pixels in the second sub-pixel density distribution area and sub-pixels in the third sub-pixel density distribution area to emit light, the display effect of the sub-pixels in the third sub-pixel density distribution area is the same as that of the sub-pixels emitting a same color in the second sub-pixel density distribution area, and when a pure color image is displayed, a light-emitting current of the sub-pixels in the third sub-pixel density distribution area is the same as that of the sub-pixels emitting a same color in the second sub-pixel density distribution area. That is, the display brightness of the sub-pixels in the third sub-pixel density distribution area is the same as that of the sub-pixels emitting a same color in the second sub-pixel density distribution area, so that the boundary between the second display area AA2 with a higher PPI and the first display area AA1 with a lower PPI in the display image of the display panel can be further blurred, obvious bright lines or dark lines at the boundary between the two display areas are avoided and the display effect is improved.

The above embodiments of the present application do not exhaustively describe all the details, nor do they limit the scope of the present application. Obviously, according to the above description, those skilled in the art cam make many modifications and changes. These embodiments are specifically described in the specification to better explain the principles and practical applications of the present application, so that those skilled in the art can make good use of the present application and make modifications based on the present application. The scope of the present application is only defined by the appended claims.

What is claimed is:

1. A display panel, having a first display area and a second display area, a transmittance of the first display area being greater than a transmittance of the second display area, the display panel comprising:
    an array substrate;
    a light-emitting layer arranged on the array substrate and comprising:
    a first sub-pixel density distribution area arranged corresponding to the first display area, wherein the first sub-pixel density distribution area comprises a plurality of first sub-pixels and a plurality of first virtual sub-pixels and one of the plurality of first virtual sub-pixels is arranged between two adjacent first sub-pixels,
        a second sub-pixel density distribution area arranged corresponding to the second display area, and
    a third sub-pixel density distribution area arranged on at least one of the first display area and the second display area and adjacent to a boundary between the first display area and the second display area; wherein a first sub-pixel distribution density corresponding to the first sub-pixel density distribution area is less than a third sub-pixel distribution density corresponding to the third sub-pixel density distribution area, and the third sub-pixel distribution density is less than a second sub-pixel distribution density corresponding to the second sub-pixel density distribution area.

2. The display panel of claim 1, wherein the second sub-pixel density distribution area comprises a plurality of second sub-pixels, the third sub-pixel density distribution area comprises a plurality of third sub-pixels; in a width direction of the display panel, the third sub-pixel density distribution area is disposed between the first sub-pixel density distribution area and the second sub-pixel density distribution area.

3. The display panel of claim 2, wherein a column of the third sub-pixels is arranged in a direction perpendicular to the width direction.

4. The display panel of claim 2, further comprising:
    a plurality of second virtual sub-pixels disposed in the third sub-pixel density distribution area; wherein a first pixel arrangement formed by the first sub-pixels and the first virtual sub-pixels is the same as a second pixel arrangement formed by the second sub-pixels;
    a third pixel arrangement formed by the third sub-pixels and the second virtual sub-pixels is the same as the second pixel arrangement.

5. The display panel of claim 4, wherein in the third pixel arrangement, one of the plurality of second virtual sub-pixels is arranged between two adjacent third sub-pixels.

6. The display panel of claim 4, wherein for the first sub-pixels in adjacent two columns, the first sub-pixels emitting a same color are in different rows; or
    for the first sub-pixels in adjacent two rows, the first sub-pixels emitting a same color are in different columns.

7. The display panel of claim 4, wherein the first sub-pixels in a same row or a same column emit same colors; and/or
    the third sub-pixels emit a color different from colors emitted by both the first sub-pixels and the second sub-pixels adjacent to the third sub-pixels.

8. The display panel of claim 2, further comprising:
    a first pixel circuit disposed in the second display area and electrically connected with the first sub-pixels to drive the first sub-pixels to display; and
    a second pixel circuit disposed in the second display area and electrically connected with both the second sub-pixels and the third sub-pixels to drive the second sub-pixels and the third sub-pixels to display.

9. The display panel of claim 2, wherein each of the first sub-pixels comprises a first electrode, a light-emitting structure and a second electrode that are stacked in sequence.

10. The display panel of claim 9, wherein a projection of the first electrode in a direction perpendicular to the display panel comprises one second graphic unit or two or more second graphic units connected together, and the second graphic unit comprises at least one selected from a group comprising a round shape, an oval shape, a dumb-bell shape, a gourd shape and a rectangle shape.

11. The display panel of claim 9, wherein the first electrode of the first display area is a light-transmitting electrode.

12. The display panel of claim 9, wherein the first electrode of the first display area is a reflective electrode.

13. The display panel of claim 9, wherein the first electrode of the first display area comprises at least one of an indium tin oxide layer, an indium zinc oxide layer, and a magnesium-silver alloy layer.

14. The display panel of claim 9, wherein a projection of the light-emitting structure in a direction perpendicular to the display panel comprise one first graphic unit or two or more first graphic units spliced together, and the first graphic unit comprises at least one selected from a group comprising a round shape, an oval shape, a dumb-bell shape, a gourd shape and a rectangle shape.

15. A display panel, having a first display area and a second display area, a transmittance of the first display area being greater than a transmittance of the second display area, the display panel comprising:
    an array substrate;
    a light-emitting layer arranged on the array substrate and comprising a first sub-pixel density distribution area arranged corresponding to the first display area, a second sub-pixel density distribution area arranged corresponding to the second display area, and a third sub-pixel density distribution area arranged on at least one of the first display area and the second display area and adjacent to a boundary between the first display area and the second display area;
    wherein a first sub-pixel distribution density corresponding to the first sub-pixel density distribution area is less than a third sub-pixel distribution density corresponding to the third sub-pixel density distribution area, and the third sub-pixel distribution density is less than a second sub-pixel distribution density corresponding to the second sub-pixel density distribution area;
    wherein the first sub-pixel density distribution area comprises a plurality of first sub-pixels, the second sub-pixel density distribution area comprises a plurality of second sub-pixels, the third sub-pixel density distribution area comprises a plurality of third sub-pixels;
    in a width direction of the display panel, the third sub-pixel density distribution area is disposed between the first sub-pixel density distribution area and the second sub-pixel density distribution area;
    a plurality of first virtual sub-pixels disposed in the first sub-pixel density distribution area;
    a plurality of second virtual sub-pixels disposed in the third sub-pixel density distribution area;

wherein a first pixel arrangement formed by the first sub-pixels and the first virtual sub-pixels is the same as a second pixel arrangement formed by the second sub-pixels;

a third pixel arrangement formed by the third sub-pixels and the second virtual sub-pixels is the same as the second pixel arrangement.

16. The display panel of claim 15, wherein in the first pixel arrangement, one of the plurality of first virtual sub-pixels is arranged between two adjacent first sub-pixels.

17. The display panel of claim 15, wherein in the third pixel arrangement, one of the plurality of second virtual sub-pixels is arranged between two adjacent third sub-pixels.

18. The display panel of claim 15, wherein for the first sub-pixels in adjacent two columns, the first sub-pixels emitting a same color are in different rows; or for the first sub-pixels in adjacent two rows, the first sub-pixels emitting a same color are in different columns.

19. The display panel of claim 15, wherein the first sub-pixels in a same row or a same column emit same colors; and/or the third sub-pixels emit a color different from colors emitted by both the first sub-pixels and the second sub-pixels adjacent to the third sub-pixels.

20. A display panel, having a first display area and a second display area, a transmittance of the first display area being greater than a transmittance of the second display area, the display panel comprising:

an array substrate;

a light-emitting layer arranged on the array substrate and comprising a first sub-pixel density distribution area arranged corresponding to the first display area, a second sub-pixel density distribution area arranged corresponding to the second display area, and a third sub-pixel density distribution area arranged on at least one of the first display area and the second display area and adjacent to a boundary between the first display area and the second display area;

wherein a first sub-pixel distribution density corresponding to the first sub-pixel density distribution area is less than a third sub-pixel distribution density corresponding to the third sub-pixel density distribution area, and the third sub-pixel distribution density is less than a second sub-pixel distribution density corresponding to the second sub-pixel density distribution area;

wherein the first sub-pixel density distribution area comprises a plurality of first sub-pixels, the second sub-pixel density distribution area comprises a plurality of second sub-pixels, the third sub-pixel density distribution area comprises a plurality of third sub-pixels;

in a width direction of the display panel, the third sub-pixel density distribution area is disposed between the first sub-pixel density distribution area and the second sub-pixel density distribution area;

a first pixel circuit disposed in the second display area and electrically connected with the first sub-pixels to drive the first sub-pixels to display; and a second pixel circuit disposed in the second display area and electrically connected with both the second sub-pixels and the third sub-pixels to drive the second sub-pixels and the third sub-pixels to display.

\* \* \* \* \*